United States Patent [19]

Azzis et al.

[11] 4,231,020
[45] Oct. 28, 1980

[54] DIGITAL TO ANALOG CONVERTER HAVING SEPARATE BIT CONVERTERS

[75] Inventors: Daniel Azzis, Villeneuve Loubet; Francois X. Delaporte, Cros de Cagnes, both of France

[73] Assignee: International Business Machines Corporation, Armonk, N.Y.

[21] Appl. No.: 938,273

[22] Filed: Aug. 29, 1978

[30] Foreign Application Priority Data

Sep. 30, 1977 [FR] France ................. 77 30171

[51] Int. Cl.² .................................. H03K 13/02
[52] U.S. Cl. ....................................... 340/347 DA
[58] Field of Search ............... 340/347 DA, 347 M

[56] References Cited
U.S. PATENT DOCUMENTS

| | | | |
|---|---|---|---|
| 3,842,412 | 10/1974 | Spofford | 340/347 DA |
| 3,940,760 | 2/1976 | Brokaw | 340/347 DA |
| 3,961,326 | 6/1976 | Craven | 340/347 DA |
| 4,055,773 | 10/1977 | Schoeff | 340/347 DA |
| 4,056,740 | 11/1977 | Schoeff | 340/347 DA |

Primary Examiner—Charles D. Miller
Attorney, Agent, or Firm—Edward H. Duffield

[57] ABSTRACT

This invention relates to a digital to analog converter in general and specifically to unitary or monolithic miniature digital to analog converters designed to be fully embodied on a single one-half inch module without requiring external converter components. The digital to analog converter comprises n binary current sources and n two-way switches, n being the number of input word bits. Each switch is driven by a bit input and its function is to steer the current of the corresponding source either into a summing line for output or into a dump line. A primary feature of this converter is the separation of all individual bit converter structures comprising a current source and steering means into two different groups. In this scheme, a first group of converter structures is used to convert the high order bits and a second group of converter structures is used to convert the low order bits. This arrangement allows the provision of different types of current sources for the different converter structures depending upon the accuracy required for each current source. Control inputs are provided for acting upon the steering means to generate reference levels to which an input analog signal in an A/D converter is compared. By this technique, the D/A converters of the present invention may be utilized in A/D encoding and an improved conversion accuracy of about zero is provided.

4 Claims, 9 Drawing Figures

DIGITAL TO ANALOG CONVERTER HAVING SEPARATE BIT CONVERTERS

DESCRIPTION

1. Field of Invention

This invention relates generally to a D/A converter (DAC) and more particularly to an entirely monolithic D/A converter which can be integrated on a single module without external components. Also, this invention relates to the use of such a converter in the implementation of an A/D (ADC) converter.

2. Prior Art

The D/A converter of this invention is of the type including weighted current sources, the number of which is equal to the number of bits of the words which can be processed by the converter. Each current source is associated to a switching means which receives a bit of the word to be converted as a control signal. According to the value of this bit, the current supplied by the corresponding source is directed either into a summing resistor or into a dump resistor.

D/A converters of this type are well known in the art as discussed or described in the following literature:

"A Complete Monolithic 10-b D/A Converter," by D. J. Dooley, published in the IEEE Journal of Solid State Circuits, Vol. Sc. 8, No. 6, December 1973.

See also: Electronics, April 4, 1974, page 125, which shows similar circuits.

The French patent application 75 27557 filed in France on Sept. 9, 1975, which corresponds to U.S. Pat. No. 3,961,326, also shows a typical prior art converter.

Both converters described in the above-indicated literature are of the type switching weighted currents either in a summing line or at the ground. These switching devices are under the control of the bits of the word to be converted. The Dooley converter, which can be fully integrated, can process only words of 10 bits (plus a sign bit), and it requires high supply voltages from ±12 volts to ±18 volts. The converter described in this reference can process words of 12 bits but it is a bit more cumbersome when operated in the 12 bit mode. In addition, it delivers only current. Consequently, if a voltage output is required, it is necessary to add an output amplifier which increases the overall dimensions of the unit and decreases the response speed. This amplifier is also provided in the Dooley converter, but it is integrated.

Both types of devices referred to above show response times and accuracies satisfactory for various applications, but these characteristics can prove insufficient for other applications. In particular, when a response time lower than a microsecond is required, they are inadequate.

OBJECTS OF INVENTION

Consequently, an object of this invention is to provide an improved and entirely monolithic digital/analog converter with very small overall dimensions.

Another object of this invention is to provide an improved and very accurate D/A converter having a short response time.

Another object of this invention is to provide an improved and inexpensive D/A converter.

Another object of this invention is to provide an improved D/A converter of a type particularly suited for application to an A/D converter of the successive approximation type.

BRIEF SUMMARY OF SPECIFICATION

The converter of this invention converts 12 bit words with a response time lower than one microsecond.

Owing to its particular design, it shows a very small linearity or convergence error which is equal, in the worst case, to half of the least significant bit for any group of eight consecutive bits. In addition, although it delivers a voltage output, its overall dimensions are reduced and it can be fully integrated on a module, the sides of which are 1.25 cm long. This advantage is obtained by substituting an output resistor of small dimensions integrated on the module for the output amplifiers which are generally used in the converters known in the art to transform a current output into a voltage output.

The converter of this invention includes twelve weighted current sources each of which is associated with one of twelve independent switching circuits. Each switching circuit is controlled by a bit of the word to be converted. The circuit controlled by the bit with the highest order is associated with the source providing the highest current. In the preferred embodiment of this invention, when the bit controlling a switching circuit is equal to 0, the current provided by the source associated with said switching circuit is fed into an output summing line. When said bit is equal to 1, the current is fed into a dump line.

The entire set of converter element pairs for the full complement of bit converters comprised of a current source and a switching circuit is divided into two groups of distinct structures. In effect, the accuracy of the currents corresponding to the bits with the highest orders is required to be very high since they contribute the largest currents in forming the output analog value. Consequently, the first group of current source/switching circuit pairs includes five very accurate current sources and five associated switching circuits of a first type. The second group of current source/switching circuit pairs includes at least seven less accurate current sources and the associated switching circuits of a second type which are therefore less complicated than the high accuracy ones. These are also less accurate, but are very fast and have small overall dimensions. This division of the current sources and switching circuit pairs into two groups ensures for each group the best compromise between the opposing requirement of high accuracy and speed but small overall dimensions. The continuity between the currents provided by the sources of the two groups and their respective scaling are ensured by three auxiliary sources. These are, respectively, a master source for monitoring and regulating the high order currents, high order image source and a master source for monitoring and regulating the low order currents. There are further provided two scaling circuits, a first one called the high order current scaling circuit and a second one called the low order current scaling circuit for controlling the value of the current provided by the low order current monitoring source from the current provided by the high order image source.

In addition, the converter includes a scaling and output circuit provided with an output resistor one terminal of which is connected to the output summing line, and further including a dump resistor, one terminal of which is connected to a dump summing line. The other terminals of these resistors are connected to a reference voltage $V_{REF}$ generated within the module. The output and dump resistors and scaling resistors connected to the circuit for scaling the high order currents are located close to one another to be perfectly matched. The ratios of these output, dump and scaling resistors are calculated to have the dynamics of the output signal within $+V_{REF}$ and $-V_{REF}$. In this way, by modifying $V_{REF}$, a two sector-multiplier can be provided. For this purpose, $V_{REF}$ is chosen equal to the positive multiplicand of the product to be carried out and the digital word applied to the converter is chosen equal to the desired multiplier.

In accordance with this invention, the converter includes two additional controls called "Force" and "Inhibit." The purpose of the "Force" control is to force the currents provided by all the sources into the output summing line regardless of whatever the converter input bit pattern may be. The purpose of the "Inhibit" control is to send all the currents provided by all the sources into the dump line regardless of whatever the converter input bit pattern may be.

These two controls are particularly advantageous when the converter of this invention is used in an A/D converter of the successive approximation type. The converters of this type generally include a comparator comparing the analog signal to be converted to successively generated reference levels. These reference levels can be generated by a D/A converter. According to the result of the comparison, a logic circuit successively applies bit patterns to which correspond various reference levels, to the converter inputs.

These devices are well known in the art, and it is possible to refer the reader to the book entitled, "Analog to Digital/Digital to Analog Conversion Technique," by David F. Hoeschele Jr., published by John Wiley and Sons, Inc., page 360.

To obtain a good accuracy, in particular around zero, it is known in the art to use two D/A converters. In the art, a first converter is used for generating the positive reference levels and a second one is used for generating the negative reference levels. When the D/A converter of the present invention is used in such an application, the "sign" bit of the bit pattern to be converted acts on the "Force" and "Inhibit" controls.

When the "sign" bit indicates a positive number, the "Inhibit" control acts on the second converter and the first one operates normally. When the "sign" bit indicates a negative number, the "Force" control acts on the first converter while the second converter operates normally.

These and other objects, advantages and features of the present invention will become more readily apparent from the following specification when taken in conjunction with the drawings.

DETAILED SPECIFICATION

Figure 1:
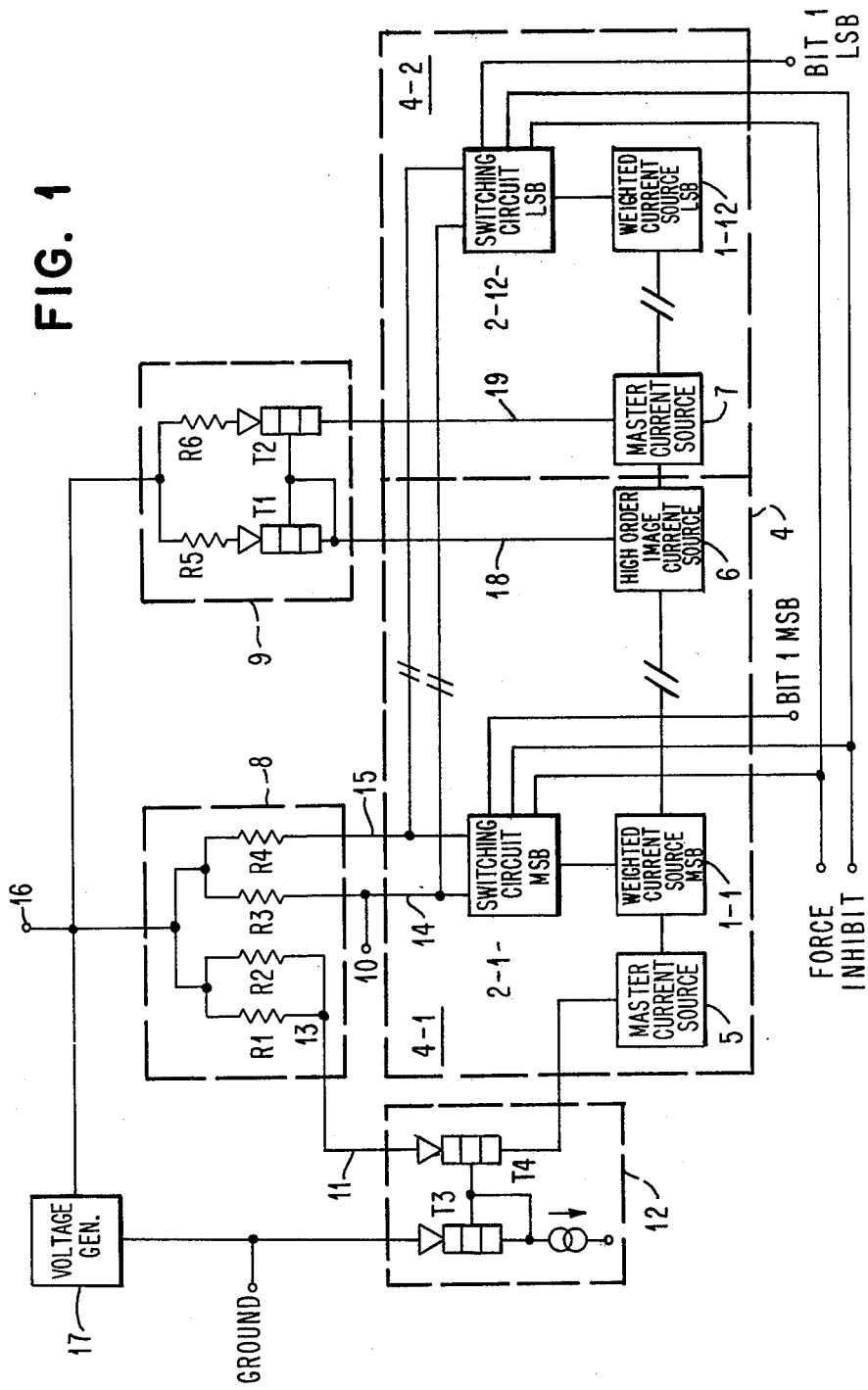
FIG. 1 is a block diagram of the structure of the converter of this invention.

The general principle of this invention will be described with reference to FIG. 1.

The converter includes weighted current sources, the number of which is equal to the number of bits in the words to be converted. As described herein, 12 word bits plus one more bit are used in the preferred embodiment of this invention. This 13th bit source is not compulsory and its function will be explained later. Only two of these sources are shown on the drawing, namely the one corresponding to the most significant bit, source 1-1 and the one corresponding to the least significant bit, source 1-12. The ratio of the currents provided by any two adjacent bit sources is equal to 2. Thus, if source 1-12 delivers a current unity I, source 1-1 delivers a current equal to $I \times 2^{11}$.

A switching circuit 2 is associated with each current source. For example, circuit 2-1 is associated with source 1-1 and circuit 2-12 is associated with source 1-12.

Assembly 4 including the current sources and the switching circuits is divided into two groups 4-1 and 4-2. The first group 4-1 includes the five current sources and switching circuits corresponding to the first five high order bits. The second group 4-2 includes the seven current sources and switching circuits corresponding to the next seven low order bits, and a thirteenth source plus its associated switching circuit.

Each group includes additional current sources, namely a master source 5 for controlling the high order currents, a high order image source 6 and a master source 7 for controlling the low order currents. The values and functions of the currents provided by these sources will be indicated later.

The converter also includes two scaling circuits, the first one being comprised of circuits 8 and 12 and the second one of circuit 9. The function of circuit 8 is to transform the sum of the currents provided by the weighted sources into a voltage output from terminal 10. Circuits 9 is the low order current scaling circuit. Circuit 8 is connected, on the one hand, to master source 5 by line 11 through scaling circuit 12. The function of circuit 12 is to create a virtual ground at point 13 and to provide the scaling current to circuit 5. Circuit 8 is also connected through lines 14 and 15 to switching circuits 2-1 through 2-12. Circuit 8 includes four resistors R1, R2, R3 and R4. One of the terminals of resistors R3 and R4 is connected to conductors 14 and 15, respectively, and the other terminals of resistors R3 and R4 are connected in common to a node 16 to which is applied a reference voltage $V_{REF}$ provided by generator 17 located within the module.

Resistors R1 and R2 are mounted in parallel between nodes 13 and 16.

Low order current scaling circuit 9 is schematically shown on FIG. 1 as comprised of a current mirror including two transistors T1 and T2, the emitters of which are connected to two resistors R5 and R6, respectively. This circuit is shown in detail in FIG. 7. The second terminals of the resistors R5 and R6 are connected to node 16. Transistor T1 is diode mounted. Its base and its collector being connected together, and the base of transistor T1 is also connected to the base of transistor T2, the collector of which is connected to image source 6 through line 18. The collector of transistor T2 is also connected to master source 7 for controlling the low order bits through conductor 19. Consequently, the current carried by conductor 19 is equal to the current carried by conductor 18 and multiplied by the ratio R5/R6.

Circuit 12 is shown on FIG. 1 as including two transistors T3 and T4. Transistor T3 is diode mounted, its base and its collector being connected together. Its emitter is connected to ground and its collector is biased by a current equal to the current in T4. The base of transistor T3 is connected to the base of transistor T4, its collector is connected to source 5 and its emitter is connected to point 13. Consequently, the voltage across point 13 is equal to $$-V_{BE\ T3} + V_{BE\ T4},$$

where $V_{BE\ T3}$ and $V_{BE\ T4}$ are the base/emitter voltages of transistors T3 and T4, respectively.

If transistors T3 and T4 match perfectly, the voltage across node 13 is equal to zero. It should be understood that this circuit includes scaling elements which will be described with reference to FIG. 6.

The operation of the circuit shown on FIG. 1 will now be described.

Each switching circuit 2-1 through 2-12 is provided with three control terminals. One of these terminals receives a bit of the word to be converted and the two other terminals receive the "Force and "Inhibit" controls. The purpose of these switching circuits is to direct the current provided by the associated source either to output summing line 14 or to dump line 15, according to the controls applied to the switching circuits. Switching circuit 2-1 is controlled by highest order bit MSB and circuit 2-12 is controlled by lowest order bit LSB.

If the "Force" and "Inhibit" controls are deconditioned, the switching circuits are responsive to the bits only. Consequently, the currents provided by the sources associated with switching circuits controlled by bits of value 0 are directed onto output line 14 and the currents provided by the sources associated with switching circuits controlled by bits of value 1 are directed onto dump line 15.

But, if the "Force" control is conditioned and the "Inhibit" control deconditioned, the currents provided by all the sources are directed onto line 14 whatever the value of the bits across the bit control terminals may be.

On the contrary, if the "Force" control is deconditioned and the "Inhibit" control conditioned, the currents provided by all the sources are directed onto dump line 15 whatever the value of the bits across the bit control terminals may be.

In the particular embodiment of this invention, source 5 provided for monitoring the high order sources is a current source. It delivers a current equal to the one of source 1-2, i.e., equal to $I \times 2^{10}$. Sources 1-1 to 1-5 and sources 6 are slave sources of source 5 and provide the high order currents. Source 5 provides a current equal to the one of source 1-4, namely $I_S = I \times 2^8$.

Source 7 which is the master source for low order slave sources 1-7 to 1-12 is chosen to provide a current equal to the one of source 1-6. For this purpose, the resistance R5/R6 ratio is equal to ¼, which makes the current on conductor 19 equal to $I \times 2^8 \times 2^{-2} = I = 2^6$. This corresponds to the value of the current provided by source 6.

It should be understood that the values of the currents provided by auxiliary sources 5, 6 and 7 are chosen for a particular embodiment of this invention and that these values can be modified provided that the values of the resistors forming the R1/R2 ratio are modified accordingly.

Resistance R3 is used for summing the currents since it is connected between a voltage $+V_{REF}$ and output 10. The maximum output voltage is equal to $V_{REF}$ when there is no bit current in output line 14. The resistances forming the R1/R4 ratio are chosen so that the dynamics of the output signal are equal to $2V_{REF}$. This gives a minimum output voltage $-V_{REF}$ when all the currents are summed in resistor R3.

It will be shown now that the resistor ratios give this output signal dynamic characteristic.

Circuit 12 applies high order currents to master source 5, a scaling current.

$$I_{CAL} = [(R1+R2)/R1R2]\ V_{REF}$$

by choosing $R1 = R2 = R_{CAL}$, one has:

$$I_{CAL} = 2V_{REF} R_{CAL}$$

Output signal dynamics $2V_{REF}$ is equal to $R3 \times I_{S\ MAX}$, $I_{S\ MAX}$ being the maximum output current.

Consequently, since current $I_{CAL}$ has been chosen equal to the one provided by source 2-2, it is equal to current $I_{S\ MAX}$ divided by four. To make the dynamics of the output signal equal to $2V_{REF}$, it is, therefore, necessary to have $R3 = R_{CAL}/4$.

Resistor R4 is chosen equal to resistor R3, which allows the complementary current of the one summed into resistor R3 to be summed in resistor R4.

The voltages across the terminals of R3 and R4 are, therefore, always in opposite phase. This is used to accelerate the high order current switching.

Figure 2:
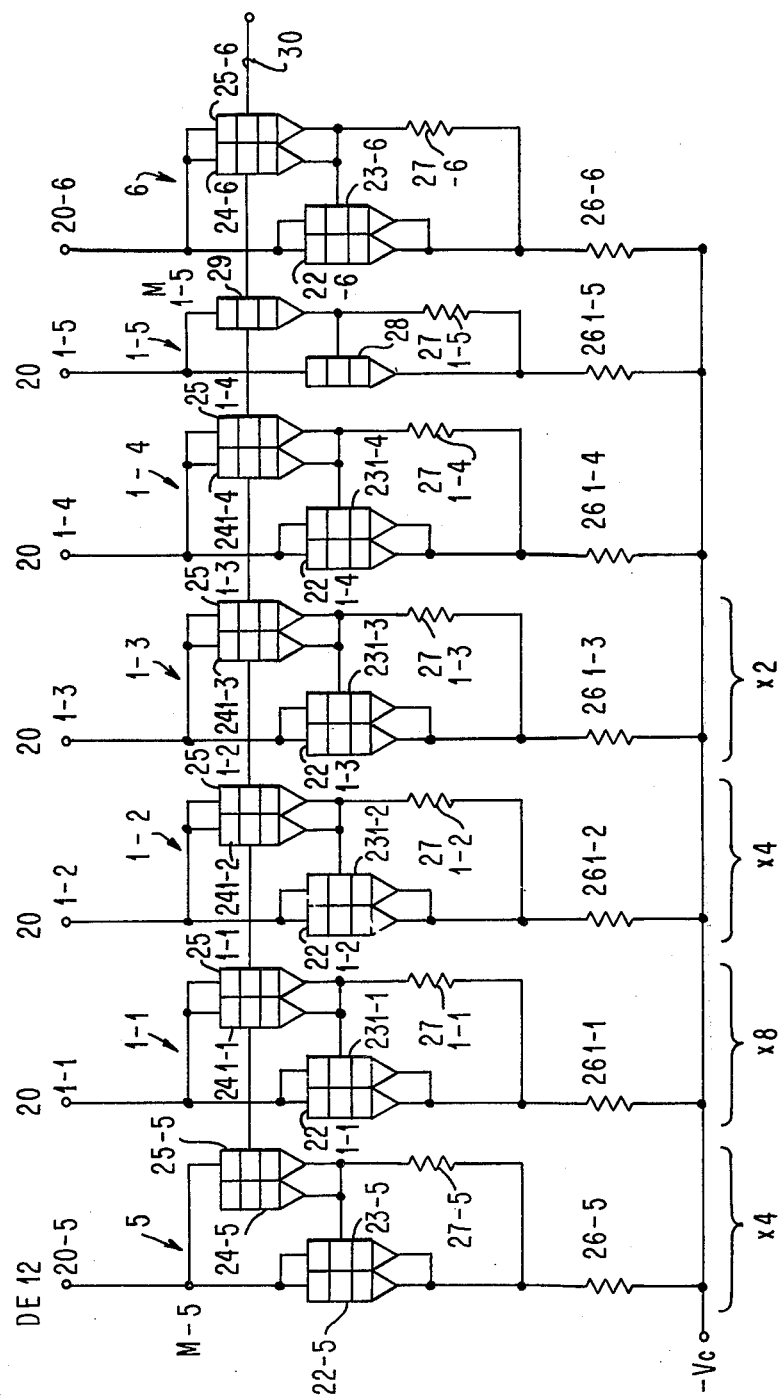
FIG. 2 illustrates the first group of high order current sources.

With reference to FIG. 2, the following will describe how the sources of high order currents 5, 1-1 to 1-5 and 6, are embodied. These sources bear the same reference numbers as in FIG. 1.

All the sources but source 1-5 are comprised of identical cells. Weighting is performed by arranging several of these cells in parallel. For instance, source 1-1 includes eight cells, source 1-2 includes four cells, source 1-3 includes two cells and source 1-4 includes one cell. Auxiliary sources 5 and 6 provide currents equal to the ones of sources 1-2 and 1-4, respectively, and show the same structures as these sources.

As explained while referring to FIG. 1, source 5 is a master source which controls the weighted current sources connected thereto. A current $I_{CAL}$ is provided to master source 5 by circuits 8 and 12 of FIG. 1.

The components forming each cell bear the same references followed by a suffix corresponding to the current source in which they are incorporated. In the general description of a cell, only the reference number without suffix will be indicated. Each cell of sources 1-1 to 1-4 includes four transistors 22 to 25 and two resistors 26 to 27.

The transistors are arranged two by two, in parallel, i.e., transistors 22 and 23 are grouped. Their emitters, bases and collectors are interconnected. It is the same for transistors 24 and 25. Transistors 22 and 23 and transistors 24 and 25 are mounted in Darlington mode. To this end, the collectors of transistors 24 and 25 are connected to the collectors of transistors 22 and 23 in point M. The emitters of transistors 24 and 25 are connected to the bases of transistors 22 and 23 on the one hand, and to the emitters of the same transistors on the other hand, through a resistor 27. The connection point of the emitters of transistors 22 and 23 and of resistor 27 is connected to a power supply $-V_c$ through resistor 26. Each of the cells operates as a current generator.

The bases of transistors 24, 25 of all the cells forming current sources 5, 1-1 to 1-4 and 6 are interconnected by a conductor 30 biased by an appropriate voltage.

Since each source is comprised of several cells as indicated above, the cells of a source are mounted in parallel between point M and voltage $-V_c$.

In source 5, circuit 12 of FIG. 1 applies a current $I_{CAL}$ to point M-5. Consequently, a current $I_{CAL}/4$ flows in each of the cells forming source 5 since there are four cells in source 5.

Since the bases of transistors 24-5 and 25-5 are connected to the bases of the corresponding transistors in weighted sources 1-1 to 1-4 and 6, the base-emitter voltages between the bases of transistors 24-25 and the emitters of transistors 22 and 23 in the cells forming said weighted sources are equal to the corresponding base-emitter voltage in the cells of source 5. Consequently, the components of all the cells being perfectly matched, each cell contributes to apply a current equal to $I_{CAL}/4$ to point M to which it is connected.

Source 1-5 uses the same structure and the same components as each of the cells described above, but the transistors are not dually mounted.

Source 1-5 includes only two Darlington mounted transistors 28 and 29. The base of transistor 29 is connected to the bases of transistors 22 and 24 of all the cells. The collectors of transistors 28 and 29 are connected to point M 1-5. The emitter of transistor 29 is connected to the base of transistor 28 on the one hand and to the emitter of the same transistor on the other hand through a resistor 27 1-5, the value of which is twice as high as the value of resistors 27 of the other cells. The common point of resistor 27 and the emitter of transistor 28 is connected to voltage $-V_c$ through a resistor 26 1-5, the value of which is also twice as high as the value of resistors 26 of the other cells.

In this way, since the transistors are not dually mounted and the values of the resistors are doubled in this cell, the current which is generated is equal to half the current generated by a cell constituting sources 1-1 to 1-4, 5 and 6.

Terminals 20 1-5, 20 1-1, 20 1-2, 20 1-3, 20 1-4, connected to points M of the corresponding sources, are the terminals which should be connected to the current switching circuits. Terminal 20-6 should be connected to circuit 9 by conductor 18 of FIG. 1.

At last, the arrangement of identical cells in parallel to form the various current sources is carried out on the physical circuit while respecting the symmetry center. Thus, when going over the series of side-by-side mounted cells and with the same orientation, there are found: a cell of source 1-1, then a cell of reference source 5, then a call of source 1-2, then a second cell of source 1-1 and so on. The single cell of source 1-5 is located on the symmetry center.

Thus, the values of the currents provided by the current sources will not respond to a linear variation of the physical characteristics of the cells.

A last advantage of the parallel arrangement of the cells should be indicated: the statistic dispersion of the ratios between the current values is reduced when the geometry of the cells has been chosen by another way at the optimum performance of the process. In other words, it increases the converter accuracy, theoretically in proportion to the square root of the number of cells.

Figure 3:
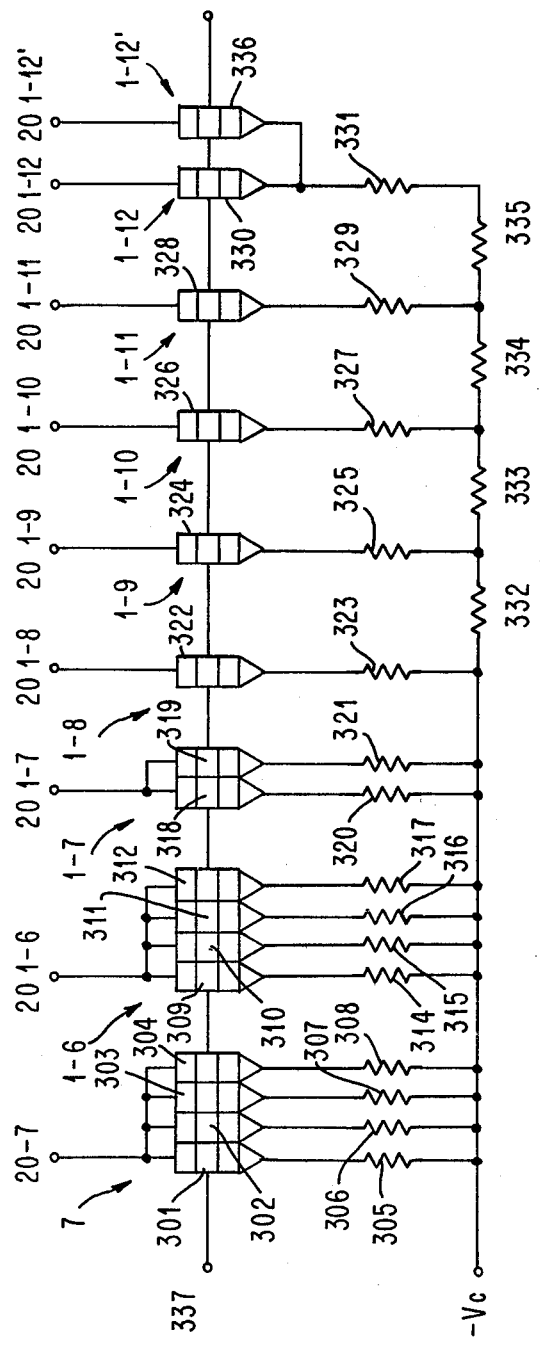
FIG. 3 illustrates the second group of low order current sources.

Now, with reference to FIG. 3, the following will describe low order current source assembly 4-2. These sources bear the same reference numbers as on FIG. 1.

Source 1-7 includes two elementary current generators identical to the elementary current generator of sources 7 and 1-6. Therefore, it is comprised of two transistors 318 and 319, the emitters of which are connected to voltage $-V_c$ through two resistors 320 and 321. The collectors of transistors 318 and 319 are connected to terminal 20 1-7 which should be linked to switching circuit 2-7.

Source 1-8 includes only one elementary current generator comprised of transistor 322, the emitter of which is connected to voltage $-V_c$ through resistor 323. Its collector is connected to terminal 20 1-8 which should be linked to switching circuit 2-8.

Current sources 1-9 to 1-12 are weighted by a ladder resistor network R-2R and current generators identical to the generator of cell 1-8.

Source 1-9 includes transistor 324, the collector of which is connected to terminal 20 1-9 and the emitter to voltage $-V_c$ through a resistor 325 with the same value as the emitter resistors of the transistors of source 7 and 1-6 to 1-8.

It is the same for sources 1-10 to 1-12 which include transistors 326, 328 and 330 and resistors 327, 329 and 331.

Resistors 332, 333, 334, 335, the value of which is approximately equal to half the value of the emitter resistors, are mounted between the terminals not connected to the emitters of resistors 323 and 325, 325 and 327, 327 and 329, 329 and 331 to weight the currents provided by identical sources as known in the art, while taking the variations of the emitter-base voltage into account from one source to another.

A source 1-12' delivering a current equal to the one delivered by source 1-12 is provided. This additional source includes a transistor 336, the collector of which is connected to a terminal 20 1-12. The base is connected to the base of transistor 330 and the emitter is connected to the emitter of said transistor. This source is not used for operating in the D/A converter mode, but it is in the application of this converter to an A/D converter. Consequently, its function will be described with reference to FIG. 9.

The bases of the transistors of all the low order current sources are connected to an appropriate biasing voltage through a conductor 337.

Figure 4:
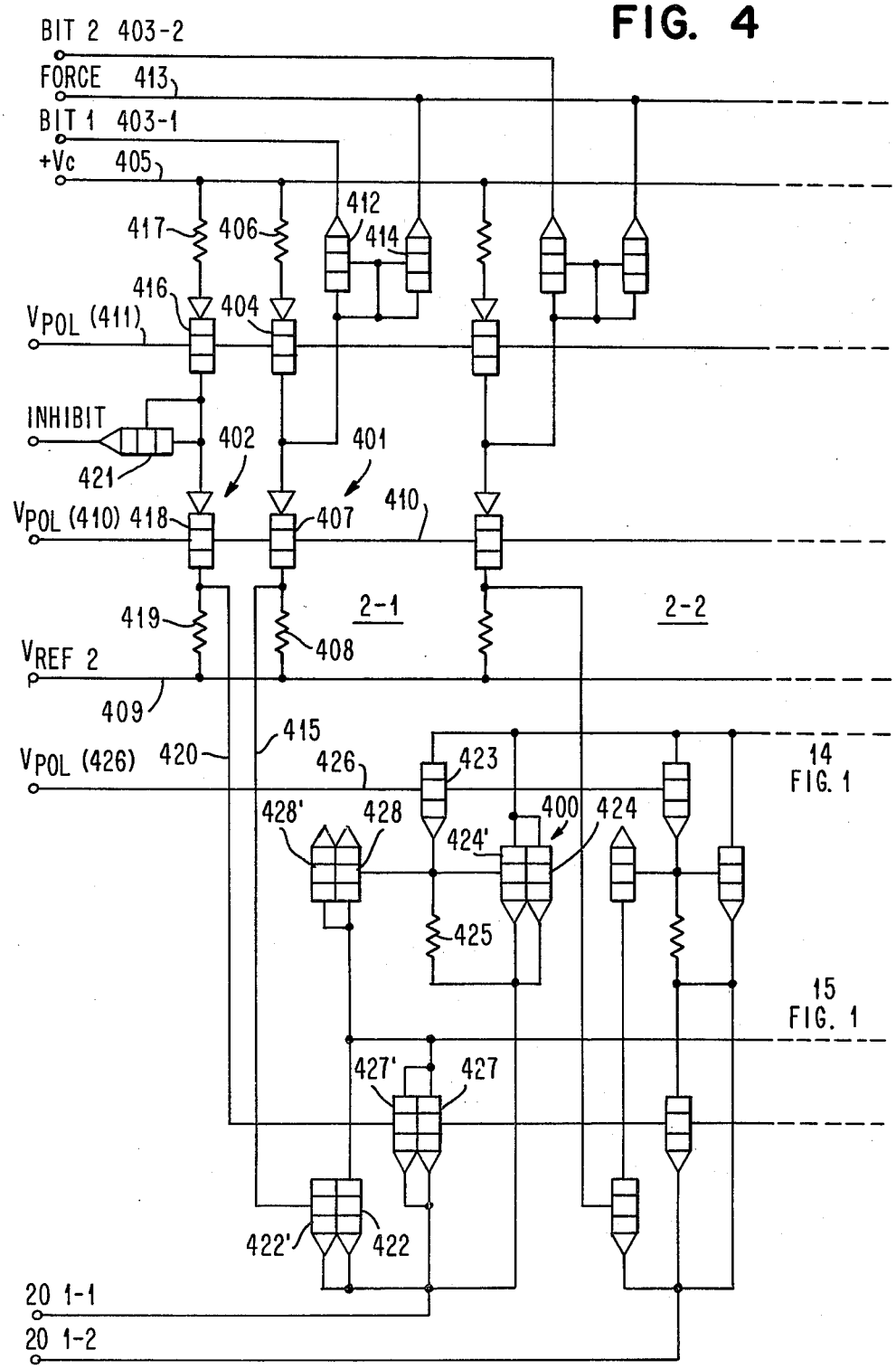
FIG. 4 shows the first group of switching circuits.

Now, with reference to FIG. 4, the switching circuits provided for directing the high order currents will be described; namely, the switching circuits 2-1 to 2-5 of FIG. 1. Since all these switching circuits show the same structure, only circuits 2-1 and 2-2 for switching sources 1-1 and 1-2 are shown in FIG. 4. Circuits 2-3 to 2-5 are identical and should be connected as circuits 2-1 and 2-2 shown on the figure.

Also, switching circuits 2-1 and 2-2 show the same structure, except that in circuit 2-1 some transistors are doubled to avoid a too high current density in the junctions, which would decrease speed and reliability.

Therefore, only one circuit will be generally described to make the drawing clearer, only the components of switching circuit 2-1 are referenced. The components of switching circuit 2-2 are shown but not referenced. When a particular component in a given switching circuit will be involved, it will be provided with the general reference number followed by the suffix corresponding to the switching circuit of which it is a part.

As shown in FIG. 4, each switching circuit includes a circuit 400 which directs the current delivered by a weighted current source connected to terminal 20 towards dump line 15. A circuit 401 receives the bit controls as well as the "Force" control and performs a level adaptation and transmits said controls to circuit 400. This circuit 401 is used for transferring the input controls to circuit 400 with a given high level and a given low level. The two levels considered vary slightly in accordance with the switch number. Their approximate values are of 1.9 volts and 0 volt measured between the transistor base as 422 and common potential $V_{REF\,2}$.

The levels are independent of the converter input logic levels insofar as they are compatible with the ones conventionally used in the TTL logic or the same.

A level shifting circuit 402 is common to all the switching circuits. This circuit is used for applying the "Inhibit" control and to make it active.

The converter input bits are applied to terminals 403-1, 403-2, ..., 403-5 for the first five bits.

Circuit 401 includes a current source transistor 404, the emitter of which is connected to line 405 delivering voltage $+V_c$ through resistor 406. In the preferred embodiment of this invention, $+V_c$ is chosen equal to 5 volts. All the other voltage values which will be given later will reflect this particular value.

The base of current source transistor 404 is connected to a DC voltage, the value of which is 1.3 volts below $V_c$, i.e., 3.7 volts in this example.

The collector of transistor 404 is connected to the emitter of a switching transistor 407. The collector of transistor 407 is connected to a DC voltage $V_{REF\,2}$ of approximately $-4,6$ volts through a resistor 408. Voltage $V_{REF\,2}$ is applied to resistors 408 of all circuits 401 2-1 to 401 2-5 through a conductor 409.

All the bases of transistors 407 2-1 to 407 2-5 are connected by a conductor 410 and all the bases of transistors 404 2-1 to 404 2-5 are connected through a conductor 411.

The bit control across terminal 403 is applied to the cathode of diode-mounted transistor 412, i.e., this cathode is comprised of the emitter of transistor 412, the base and collector of which are connected. The "Force" control applied to conductor 413 is applied to the cathode of a diode-mounted transistor 414 as transistor 412. The anodes of diode-mounted transistors 412 and 414 are connected to the emitter of transistor 407.

The collector of transistor 407 is connected to circuit 400 through conductor 415.

Circuit 402 provided for the "Inhibit" control shows a structure similar to the one of circuit 401. It includes a current source transistor 416, the emitter of which is connected to line 405 supplying voltage $+V_c$ through resistor 417. The base is connected to conductor 411 and its collector is connected to the emitter of a switching transistor 418. The base of transistor 418 is connected to conductor 410 and its collector is connected, through resistor 419, to conductor 409 supplying voltage $V_{REF\,2}$. Its collector is also connected to circuit 400 through conductor 420. The "Inhibit" control is applied to the cathode of a diode-mounted transistor 421, the base and collector of which are connected to the common point of the collector of transistor 416 and of the emitter of transistor 418.

The switching circuit includes a transistor 422 which is doubled in switch 2-1, i.e., it is associated with a transistor 422'. The bases, collectors and emitters of transistors 422 and 422' are interconnected. The base of transistor 422 is connected to the collector of transistor 407, its emitter is connected to the current source associated to terminal 20. The collector of transistor 422 is connected to dump line 15 of FIG. 1.

A Darlington assembly including two transistors 423 and 424 is connected between terminal 20 and output summing line 14. Transistor 424 is doubled in switch 2-1 and associated with a transistor 424' as noted previously. The collectors of transistors 423 and 424 are connected to line 14. The emitter of transistor 423 is connected to the base of transistor 424 and to the emitter of the same transistor through a resistor 425. The base of transistor 423 is connected to a conductor 426 which connects all the bases of transistors 423 2-1 to 423 2-5. Conductor 426 is connected to biasing voltage $V_{POL}$. The base of transistor 427 doubled with a transistor 427' in circuit 400 2-1, is connected to the emitter of transistor 418. Therefore, it will respond to the "Inhibit" signal. Its collector is connected to line 15 and its emitter is connected to the current source associated with terminal 20.

The emitter of a transistor 428, which is doubled in circuit 400 2-1 with a transistor 428', is not connected. The capacitor of the base/collector junction is mounted between the base-emitter connection of transistors 424 and 423 respectively and the collectors of transistors 422 and 427.

Now the operation of a high level switching circuit will be described.

First of all, it will be assumed in a first case that the "Inhibit" and "Force" controls are inactive, i.e., the controls at the emitters of diode-mounted transistors 421 and 414 are at the low level, and at the high level, respectively. In these conditions, diode-mounted transistor 421 is conducting and diode-mounted transistor 414 is non-conducting.

Consequently, the current provided by transistor 416 goes through diode-mounted transistor 421. Transistor 418 is OFF as well as transistor 427. The "Inhibit" control has no effect.

Since diode-mounted transistor 414 is non-conducting, the current provided by transistor 404 is not subjected to the influence of the "Force" control but only to the influence of the bit on terminal 408.

Let us assume that the bit across terminal 403 is in a low level ($<1.5$ volts). Diode-mounted transistor 412 is conducting. Consequently, the current provided by transistor 404 goes into transistor 412 and transistor 407 is OFF. Then, transistor 422 is also inhibited. Due to the biasing voltage across the base of transistor 423, Darlington assembly 423-424 is conducting and the current delivered by the source connected to terminal 20 is directed towards output summing line 14.

Conversely, if the bit across terminal 403 is in a high level ($>1.5$ volts), transistor 412 is inhibited and the current of transistor 404 goes towards transistor 407 which becomes conducting. Consequently, the voltage across the base of transistor 422 increases and said transistor 422 becomes conducting so that its action overrides the one of transistors 423 and 424 and the current provided by the source connected to terminal 20 is directed towards dump summing line 15.

If the "Inhibit" control is active, i.e., in the high level and the "Force" control is inactive, the diode-mounted transistor 421 is non-conducting. Consequently, the current of transistor 416 goes through transistor 418 which becomes conducting. This makes transistor 417 conducting and its action overrides the one of transistors 422 and 423-424 so that the current delivered by the source connected to terminal 20 goes towards dump summing line 15.

If the "Force" control is active, i.e., low level, and the "Inhibit" control inactive, diode-mounted transistor 414 is conducting so that the current of transistor 404 is derived by this transistor. Transistor 407 is OFF as is transistor 422 so that the current delivered by the source connected to terminal 20 is transferred through Darlington assembly 423-424, to output summing line 14 whatever the control across terminal 403 may be.

Transistor 428 used as a capacitor, transfers an alternating current from line 15 to the base of transistor 424. This permits compensation for the alternating current received by the base of transistor 424 when any voltage change appears on the output summing line. This increases the switching speed by compensating for the Miller effect.

In the high order current switching circuits, a Darlington assembly 423-424 is used in the path directing the current to the output line in order to avoid current losses and to increase the gain. This increases the accuracy of the circuit. This is not necessary in the path directing the currents to the dump line since in this case the accuracy is less significant.

It should be understood that it is necessary to provide additional circuits in the converter to generate appropriate continuous voltage levels $V_{POL}$ (410), $V_{POL}$ (411), $V_{POL}$ (426) required for biasing the bases of the current source transistors of the level shifting circuit. 416, 404 2-1 and 404 2-5 as well as the switching transistors of this same circuit, namely 418, 407 2-1 to 407 2-5. These circuits are not shown since their embodiment is obvious for those skilled in the art.

Now the circuits provided for switching the low order currents will be described. In these circuits, the accuracy is less critical than in the circuits provided for switching high order currents since, as said before, said currents contribute a less significant part in forming the output signal. Consequently, switching circuits 2-6 to 2-12 and 2-12' are provided with the same basic structure as switching circuits 2-1 to 2-5, except that the Darlington assembly is replaced by an assembly provided with a single transistor in order to obtain a high switching speed in spite of the small value of the currents to be switched. In addition, the accuracy is very satisfactory and the overall dimensions of these circuits are reduced.

Figure 5:
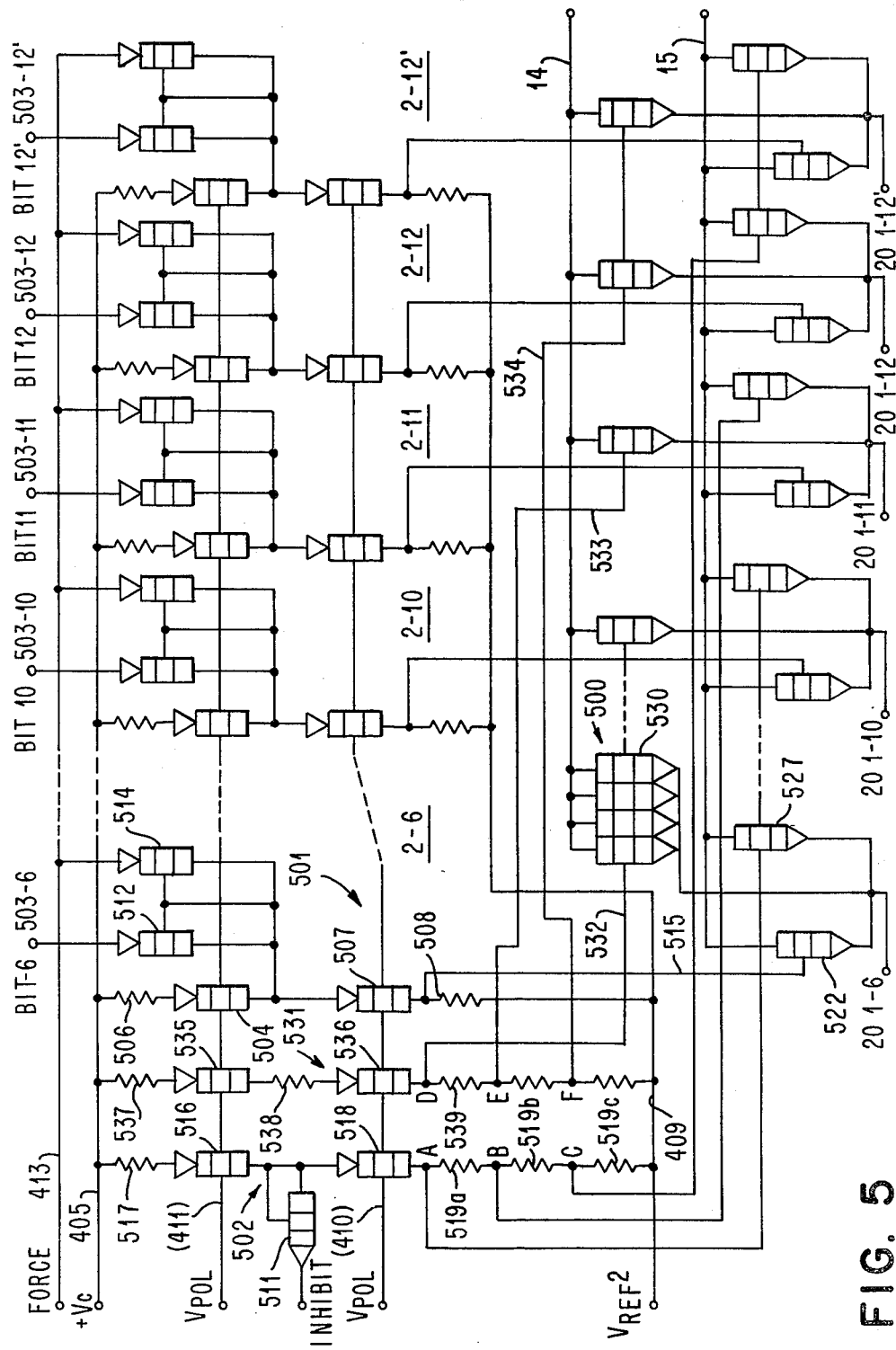
FIG. 5 shows the second group of switching circuits.

In FIG. 5 only switching circuits 2-6 and 2-10 are fully shown, as well as circuits 2-11, 2-12 and 2-12' which show some changes with respect to the previous ones. As in FIG. 4, there is shown only one of these circuits and the same reference numbers are used for the same elements in the circuits of FIGS. 5 and 4 except for the figures in the "hundred" positions.

As shown in FIG. 5, each circuit 2-6 to 2-12' includes a current directing circuut 500, a level control and shift circuit 501 and a circuit 502 common to the whole group of low level switching circuits, to apply and make the "Inhibit" control active.

The low order bits are applied to inputs 503-6 to 503-12.

Circuit 501 is provided with the same structure as circuit 401 of FIG. 4 and, therefore, it will not be described here.

Circuit 502 is also provided with the same structure as circuit 402 and it operates in the same way. The only difference is that resistor 519, similarly to resistor 419, is provided with three taps A, B, C from which are taken the controls generated from the "Inhibit" terminal acting on the bases of transistors 527 of circuits 500. The bases of transistors 527 2-6 to 527 2-10 are connected to tap A. The base of transistor 527 2-11 is connected to tap B and the bases of transistors 527 2-12 and 527 2-12' are connected to tap C.

In switching circuit 500 itself, the Darlington assembly of FIG. 4 is replaced by one or several transistors. For instance in circuit 500 2-6, the bases of four transistors bearing general reference number 530 are interconnected as well as the collectors and the emitters to form a structure having the same gain as the similar structures of circuits 2-7 and 2-8. The collectors are connected to output summing line 14, the emitters are connected to terminal 20 1-6 and the bases receive a biasing voltage generated from an additional circuit 531 on a line 532. Circuit 531 will be described later.

In circuit 500 2-7, element 530 2-7 consists of two coupled transistors only and in the other two structures 500 2-8 to 500 2-10, it consists of a single transistor, the base of which is also connected to line 532.

In circuit 500 2-11, the base of transistor 530 2-11 is connected to another biasing voltage through line 533, and in circuits 500 2-12 and 500 2-12', the bases of transistors 530 2-12 and 530 2-12' are connected to line 534.

Additional biasing circuit 531 is provided with a structure similar to structure 502, i.e., including two transistors 535 and 536. The emitter of transistor 535 is connected to line 405 through a resistor 537, its base is connected to line 411 and its collector is connected to the emitter of transistor 536 through a resistor 538. The bae of transistor 536 is connected to line 410 and its collector is connected to voltage $V_{REF\ 2}$ through a resistor 539 provided with three taps D, E, F to which lines 532, 533 and 534, respectively, are connected.

As in the circuits provided for switching the currents corresponding to the bits of high order, the signals used to control circuits 500 should have a well-defined amplitude to make sure that the ratio of the currents in the "ON" and "OFF" states for each bit current is correct in the output line.

In the circuit of FIG. 5, the biasing voltages across the bases of transistors 530 2-6 to 530 2-10 are the same as are the controls acting on the bases of transistors 527 2-6 to 527 2-10. In these transistors, the bit controls on the bases of 522 2-6 to 522 2-10 show amplitudes of 380 mV approximately and the biasing voltage across the bases of 530 2-6 to 530 2-10 is 190 mV above $V_{REF\ 2}$.

In circuit 500 2-11, the amplitude of the control applied to the base of transistor 522 2-11 is of 330 mV and the biasing voltage across the base of 530 2-11 is 160 mV above $V_{REF\ 2}$.

In circuits 500 2-12 and 500 2-12', the amplitude of the control signal on the base of transistors 522 2-12 and 522 2-12' is of 260 mV and the biasing voltage on the bases of 530 2-12 and 530 2-12' is 130 mV above $V_{REF\ 2}$.

It should be understood that these values are given only as an example and that an additional control circuit not shown here is provided to allow the level shifting circuits to generate the appropriate voltages. This can be ensured by monitoring the voltages on lines 410 and 411.

Now circuits 8, 12 and 9 provided for calibrating the high order currents will be described in detail.

Circuits 8 and 12, one function of which consists in calibrating the high order currents, are used to give a determined current value to the master source controlling the high order currents. In fact, the output current of this circuit should be exactly equal to the input current.

In circuit 8 shown in FIG. 1, output resistors R3 and R4 are chosen equal to 1 kilo-ohm and both calibrating resistors R1 and R2 have a value of 4 kilo-ohms each. As shown above, the resistance ratio defines the dynamic range of output voltage ($+V_{REF}$, $-V_{REF}$).

Output resistor R3 is connected to the output summing lines and the calibrating block 12 of the high order sources through line 11 (FIG. 1).

Figure 6:
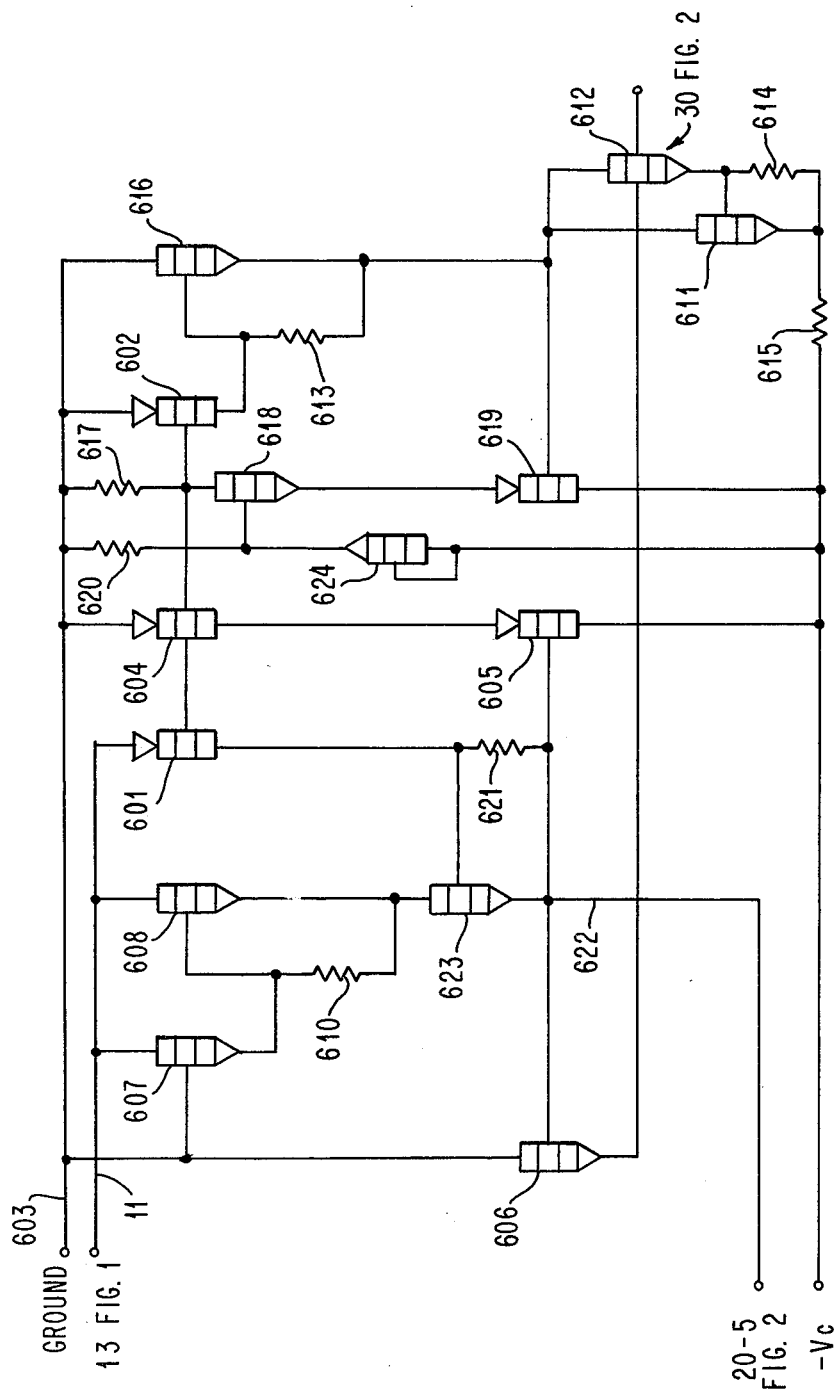
FIG. 6 illustrates the high order current scaling circuits.

Circuit 12 shown in FIG. 6 is a current mirror mainly comprised of two transistors 601 and 602. The emitter of transistor 602 is ground connected through terminal 603 and the emitter of transistor 601 is connected to line 11 of FIG. 1. The bases of transistors 601 and 602 are interconnected. The base of transistor 604 is connected to the bases of transistors 601 and 602, the emitter is connected to the ground, the collector is connected to the emitter of a transistor 605, the collector of which is connected to voltage $-V_c$.

The current flowing in line 11 is the calibrating current. It should be, on the one hand, equal to $V_{REF}$ (R1+R2)/R1 R2, which requires the emitter of transistor 601 to be virtually grounded and, on the other hand, fully transferred towards the high order calibrating source through line 622.

The first of these conditions is fulfilled by applying the same operating conditions to transistors 601 and 602, which is obtained by making resistors, 613 and 621 connected to the collectors of these transistors, equal and by making the current of the high order calibrating source, circuit 5 of FIG. 2, and the current of an auxiliary source comprised of transistors 611 and 612 associated with resistors 614 and 615, approximately equal. The collectors of transistors 611 and 612 are connected to resistor 613, the base of transistor 611 is connected to the emitter of transistor 612 and resistor 614 is connected to the emitter of transistor 612 and to the emitter of transistor 611. The emitter of transistor 611 is connected to voltage $-V_c$ through resistor 615.

To make the current of the calibrating source and the current of auxiliary source 611, 612 equal, it is sufficient to choose values for resistors 614 and 615 which are four times lower than the ones of resistors 27-5 and 26-5 of FIG. 2.

The second condition is ensured by transistor 605. The base of transistor 605 is connected to resistor 621, and the base current is equal to the one of transistor 601 since source transistor 604 operates with the same current as transistor 601. Thus, the base current of transistor 601 lost in line 11 is exactly balanced by the base current of transistor 605 applied by line 622.

Transistor 606 with its collector connected to ground, its base connected to the base of transistor 605 and its emitter connected to line 30 (FIG. 2) is an error amplifier acting on conductor 30 common to all the high order sources to force a current into source 5 which is equal to the current applied to line 11.

A circuit including two transistors 607 and 608 and a resistor 610 is used for recouping the current loss in the current directing circuit corresponding to bit 2. These transistors are arranged as follows: their collectors are connected to line 11, the base of transistor 607 is connected to ground and its emitter is connected to the base of transistor 608. The emitter of transistor 607 is also connected to the emitter of transistor 608 through resistor 610. The emitter of transistor 608 is connected to the collector of a transistor 623, the base of which is connected to the collector of transistor 601 and the emitter is connected to the base of transistor 606 and to resistor 621.

The base of transistor 616 is connected to the collector of transistor 602, the collector is connected to ground and the emitter is connected to the collectors of transistors 611 and 612. The bases of transistors 602 and 604 are also connected to ground through a resistor 617 and to voltage $-V_c$ through a transistor 618 and a transistor 619. The collector of transistor 618 is connected to the base of transistor 602, the emitter is connected to the emitter of transistor 619, the collector of which is connected to voltage $-V_c$. The base of transistor 619 is connected to the common point of the collectors of transistors 611 and 612 and of the emitter of transistor 616.

Transistor 618 is biased by a circuit including a resistor 610 and a Zener diode mounted transistor 624, i.e., mounted with its base and collector interconnected. The base of transistor 618 is ground-connected through resistor 620 and to the emitter of transistor 624, the collector of which is connected to voltage $-V_c$.

Figure 7:
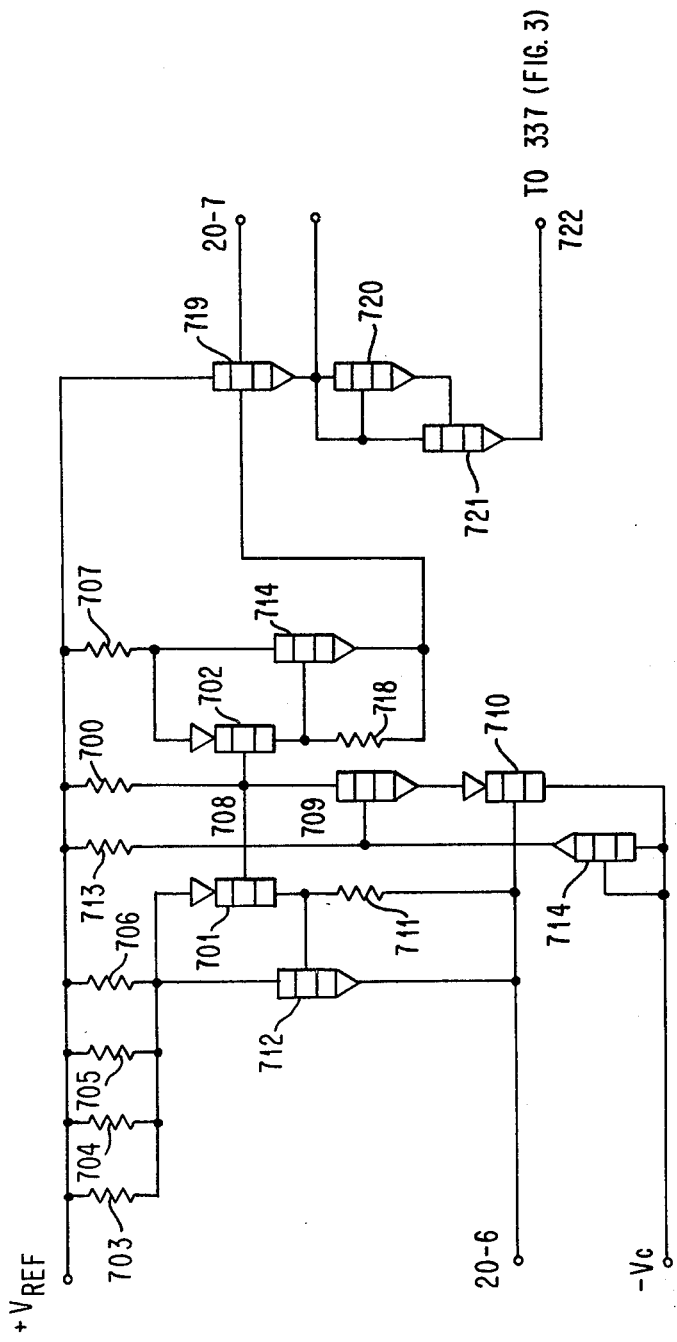
FIG. 7 illustrates the low order current scaling circuits.

Now the circuit for calibrating low order currents will be described while referring to FIG. 7.

This circuit includes a current mirror comprised of transistors 701 and 702, the emitters of which are connected to voltage $+V_{REF}$ through four resistors 703 to 706 mounted in parallel and a resistor 707, respectively. Since these resistors are provided with the same value, the emitter resistor of transistor 701 is four times smaller than the emitter resistor of transistor 702.

The bases of transistors 701 and 702 are interconnected to point 708. Point 708 is connected to voltage $+V_{REF}$ through a resistor 700 and to voltage $-V_c$ through a transistor 709, the collector of which is connected to point 708 and the emitter. Point 708 is also connected to the emitter of transistor 710, the collector of which is connected to voltage $-V_c$. The base of transistor 710 is connected to terminal 20-6. Transistor 709 is biased by a circuit including a resistor mounted between the base of transistor 709 and voltage $+V_{REF}$ and Zener diode-mounted transistor 714. The emitter of transistor 714 is connected to the base of transistor 709 and the base and the collector are connected to voltage $-V_c$.

The collector of transistor 701 is connected to terminal 20-6 of FIG. 3 through a resistor 711. It is also connected to the base of a transistor 712, the collector of which is connected to the emitter of transistor 701 and the emitter to terminal 20-6.

In this second branch of the circuit, the collector of transistor 702 is conected to terminal 20-7 through a resistor 718. It is also connected to the base of a transistor 714, the collector of which is connected to the emitter of transistor 702 and the emitter of which is connected to terminal 20-7.

The collector of transistor 719 is connected to voltage $+V_{REF}$. The base of transistor 719 is connected to terminal 20-7 and the emitter is connected to a circuit including two transistors 720 and 721. The collector of transistor 720 is connected to its base on the one hand and to the collector of transistor 721 on the other hand. The emitter of transistor 720 is connected to the base of transistor 721, and the emitter of transistor 721 is connected to a terminal 722 to which conductor 337 of FIG. 3 is to be connected.

Transistor 701 and 702 operate with the same base-emitter voltages. Since the resistor equivalent to resistors 703 to 706 is four times smaller than resistor 707, the current flowing towards terminal 20-7 is four times smaller than the one flowing towards terminal 20-6.

Transistor 719 and diode-mounted transistors 710 and 721 form an amplifier which makes the current provided to master source 7 equal to one quarter of the current provided by the source corresponding to bit 4.

Figure 8:
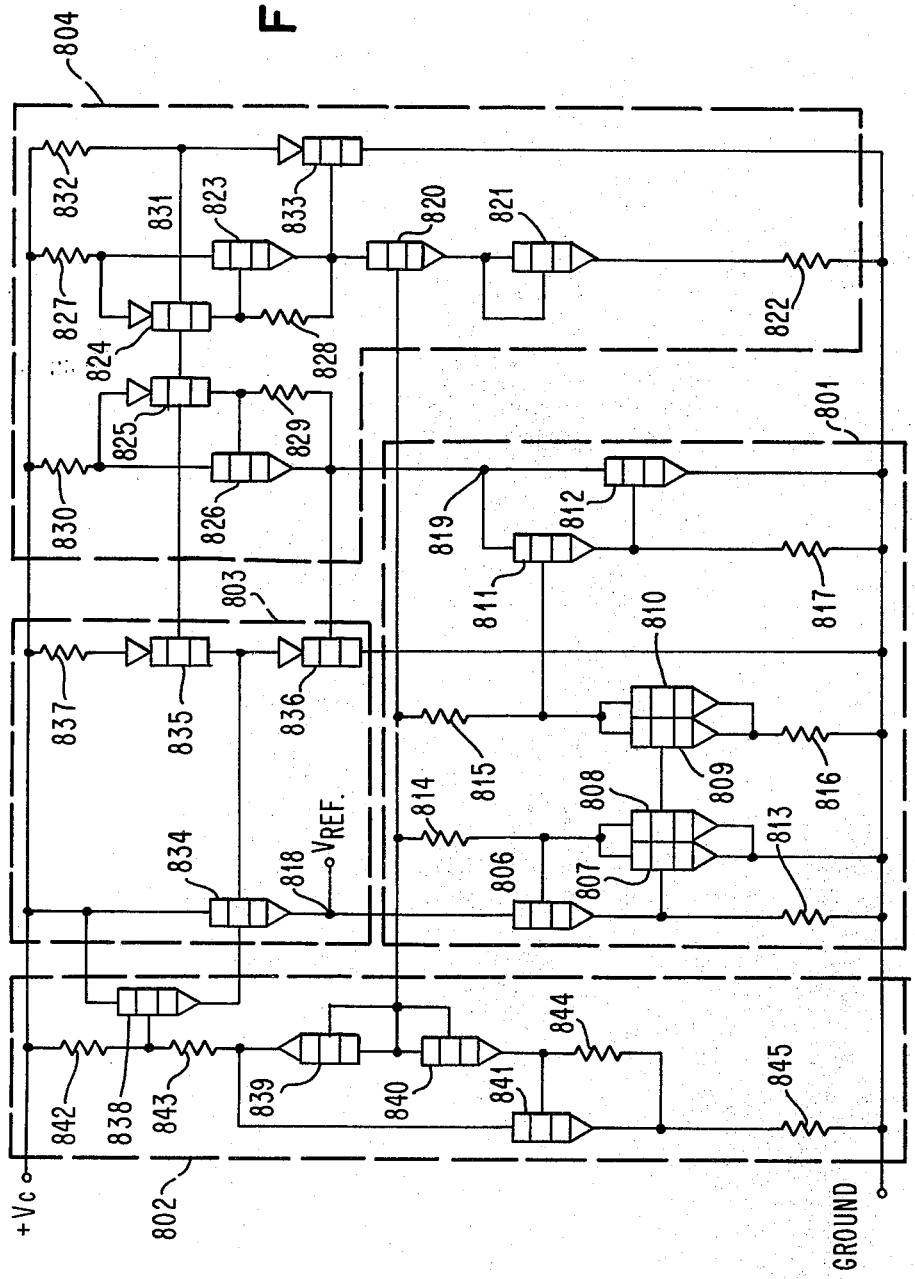
FIG. 8 diagrammatically shows the stabilized reference voltage generator.

After the description of the main elements of the converter, one will proceed to the description of the circuit generating level $V_{REF}$ while referring to FIG. 8. This block provides a temperature stabilized output voltage which, in this embodiment, is chosen equal to 2.5 volts. It is supplied from a voltage $+V_c$ of $+5$ volts. Thus, it can be noted that power supply voltages $+V_c$ and $-V_c$ are relatively lower than in the devices of the prior art, which gives a particular advantage to the converter of this invention.

This circuit includes cell 801 to provide the reference voltage, starting circuit 802, output amplifier 803 and current mirror 804.

Circuit 801 includes transistors 806 to 812 and resistors 813 to 817. This circuit provides a voltage to node 818 which depends on the current flowing through transistors 811 and 812. For a particular value of this current, this voltage is stable with respect to temperature.

Transistors 807 and 808 are matched, their bases are connected as well as their emitters and collectors. It is the same for transistors 809 and 810. The collectors of transistors 807 and 808, as well as the collectors of transistors 809 and 810 are connected to point 818 through resistors 814 and 815, respectively. The emitters of transistors 807 and 808 are directly connected to the ground and the ones of transistors 809 and 810 are connected to the ground through resistor 816.

The collector of transistor 806 is connected to point 818, the base is connected to the collectors of transistors 807 and 808 and the emitter is connected to the bases of transistors 807 and 808, and to the ground through resistor 813. The collectors of transistors 811 and 812 are commonly connected in 819. The base of transistor 811 is connected to the collector of transistors 809 and 810, its collector is connected to the base of transistor 812 and its emitter is connected to the ground through resistor 817. The emitter of transistor 812 is also connected to the ground.

This circuit operates as follows. Reference voltage $V_{REF}$ at point 818 is the sum of two voltages generated as follows.

A first voltage V1 is the sum of the base-emitter voltage of transistors 811 and 812. The current going through these transistors is kept constant and approximately equal to 0.5 mA according to the temperature.

Second voltage V2 is the voltage drop in resistor 815. The current going through this resistor is practically the same as the one going through resistor 816. Resistor 815 is chosen equal to eighteen times the value of resistor 816, so that voltage $V_{R815}$ across the terminals of resistance 815 is eighteen times greater than voltage $V_{R816}$ across the terminals of resistor 816.

i.e. $V_{R815} = 18\ V_{R816}$.

$V_{R816}$ is the differential base-emitter voltage between matched pairs of transistors 807, 808 and 809, 810.

The current ratio in transistors 807, 808 and 809, 810 is also kept constant in accordance with the temperature. These currents are defined by resistors 814 and 815.

The same voltage appears across the terminals of resistors 814 and 815 connected to transistors 807, 808 and 809, 810, namely.

$$V_{REF} - 2V_{DIODE}$$

Since resistors 814 and 815 are values interrelated with a ratio of 13, there is the same ratio for the currents flowing through transistors 807, 808 and 809, 810. Therefore, one has $$V_{R816} = (KT/q) \log_e (I_{e1}/I_{e2})$$

K being the Boltzmann constant,
T being the temperature,
q being the electron charge,
$I_{e1}$ being the emitter current of transistors 807, 808
$I_{e2}$ being the emitter current of transistors 809, 810.

According to the diode law, $V_{R816}$ is of 66 mV approx. at 25° C. and increases by 0.22 mV for every Celsius degree.

$V_{R815}$ is eighteen times greater than $V_{R816}$, i.e., equal to 1.19 volts at 25° C. plus 3.9 mV for every Celsius degree.

For a constant current through transistors 811 and 812, voltages V1 V2 compensate in temperature so that reference voltage $V_{REF}$ across point 818 is constant.

The constant current through transistors 811 and 812 is provided by circuit 804 which includes a current generator and a current mirror.

The current generator includes two transistors 820 and 821 mounted in series with a resistor 822. The base of transistor 820 is connected to point 818 and its emitter is connected to the collector of transistor 821. The collector of transistor 821 is connected to its base and its emitter is connected to the ground through resistor 822.

The collector current of transistor 820 is reflected by a current mirror in the collector path of transistors 811 and 812.

The current mirror includes four transistors 823 to 826 and four resistors 827 to 830.

Transistors 823 and 824 are mounted in the collector path of transistor 820. The emitter of transistor 823 is connected to the collector of transistor 820, its collector is connected to voltage $+V_c$ through resistor 827. The emitter of transistor 824 is connected to the collector of transistor 823, its collector is connected to the base of transistor 823 on the one hand and to the emitter of transistor 823 through resistor 828 on the other hand.

Transistors 825 and 826 are similarly mounted in the collector path of transistors 811 and 812. The bases of transistors 824 and 825 are interconnected through conductor 831. The biasing circuit of the current mirror comprises resistor 832, a terminal of which is connected to voltage $+V_c$ and the second terminal of which is connected to conductor 831, and transistor 833. The emitter of transistor 833 is connected to conductor 831, its collector is connected to the ground and its base is connected to the emitter of transistor 823.

Output amplifier 803 provides the feedback required for regulating voltage. It includes three transistors 834, 835, 836 and a resistor 837. The collector of transistor 834 is connected to voltage $+V_c$, the emitter is connected to point 818 and the base is connected to the common point of the collector of transistor 835 and of the emitter of transistor 836. The emitter of transistor 835 is connected to voltage $+V_c$ through resistor 837, and its base is connected to the bases of transistors 825 and 824. The base of transistor 836 is connected to the emitter of transistor 826 in the current mirror and its collector is connected to the ground.

Transistors 835 and 836 reduce the current mirror charge. In addition, transistors 834 and 836 are arranged to set the current mirror output voltage to 2.5 volts.

Starting circuit 802 allows the regulation on starting to be obtained. It includes four transistors 838 to 841 and resistors 842 to 845. The collector of transistor 838 is connected to voltage $+V_c$, its emitter is connected to the base of transistor 834 and its base is connected to the common point of resistors 842 and 843. Transistors 839 and 840 are diode-mounted and their collectors and bases are connected. In addition, the collector of transistor 839 is connected to the collector of transistor 840 and the common point is connected to point 818.

The emitter of transistor 839 is connected to voltage $+V_c$ through serially-mounted resistors 843 and 842. The emitter of transistor 840 is connected to the base of transistor 841 on the one hand and to its emitter through resistor 844 on the other hand. The collector of transistor 841 is connected to the emitter of transistor 839 and its emitter is connected to the ground through resistor 845.

On starting, when $V_{REF}=0$ and $V_c \geq 3.8$ volts, a current goes through transistors 838 and 834 and in the charge connected to point 819. No current is applied to transistors 840 and 841. The potential across point 818 increases up to 1.6 volts at 25° C. and then transistor 841 is OFF. When the voltage at point 819 reaches the operating point above 2 volts, transistor 841 becomes conducting, which brings the voltage across the base of transistor 838 to a value close to the voltage across the base of transistor 841. Transistor 838 is inhibited and the starting circuit is inactive. Diode-mounted transistors 839 and 840 maintain transistor 841 unsaturated.

Figure 9:
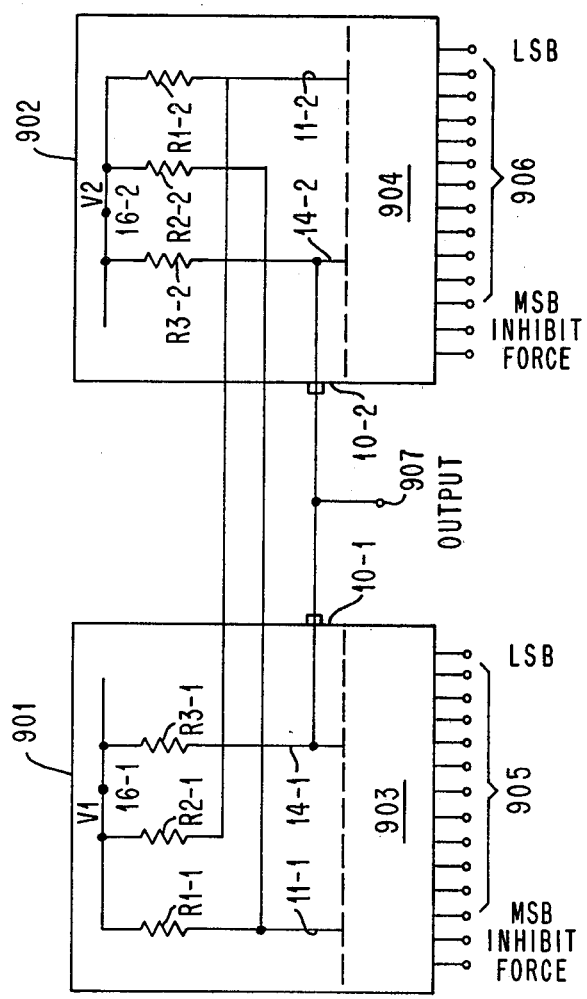
FIG. 9 shows how two D/A converters should be connected for applying this invention in the construction of A/D converters.

FIG. 9 schematically shows two D/A converter modules which can be used for generating reference levels for an A/D converter of the type described in the book entitled, "Analog to Digital and Digital to Analog Conversion Techniques," given as a reference at the beginning of this specification.

In this figure, there are shown only the connections which enable the circuits described in FIGS. 1 to 8 to be used in an A/D converter.

Two modules are provided in this application, module 901 for converting the positive numbers and module 902 for converting the negative numbers.

In these modules, each portion 903 and 904 includes circuits 4-1 and 4-2, 12, 9, 17 of FIG. 1. The bits of the words to be converted are applied to the modules through bit controls 905 and 906 and the sign bits act on the FORCE or INHIBIT controls in a way to be described later.

The elements included in circuit 8 of FIG. 1, namely calibrating resistors R1 and R2, as well as output resistor R3, are shown in each module since these elements are interconnected to ensure the continuity around zero.

In effect, it was previously shown that the calibrating currents depend on reference voltage $V_{REF}$ and on the values of the calibrating resistors. Consequently, it is to be ascertained that the calibrating currents in modules 901 and 902 are strictly equal to avoid any discontinuity of the conversion around zero. This is ensured by connecting modules 901 and 902 as shown in FIG. 9.

In this figure, elements R1, R2, R3, 10, 11 and 14 of FIG. 1 bear a suffix 1 in module 901 and a suffix 2 in module 902. Reference voltage $V_{REF}$ is called V1 in module 901 and V2 in module 902.

As shown in FIG. 9, resistor R1-1 is connected to line 11-1, on the one hand and to resistor R2-2, on the other hand. In the same way, resistor R1-2 is connected to line 11-2 on the one hand and to line R2-1 on the other hand. Output terminals 10-1 and 10-2 are interconnected to an output 907 from which is taken the output signal of the set comprised of the two modules.

In this way, the calibrating current of module 901 is equal to $V1/R1-1+V2/R2-2$ and the calibrating current of module 902 is equal to $V2/R1-2+V1/R2-1$. Since in a same module, resistors R1 and R2 are matched and, therefore, perfectly equal, it can be seen that the calibrating currents in conductors 11-1 and 11-2 are equal.

For converting a positive number, the bits of which except the sign bit are applied to controls 905 and 906, module 901 is active. The INHIBIT and FORCE controls are inactive and module 901 operates normally. Module 902 is inhibited, i.e., in this module, the control is inactive, which means that no current flows from this module to output 907.

For converting a negative number, module 902 is active. The INHIBIT and FORCE controls are inactive and the FORCE control of module 901 is active which means that all the currents of this module flow to output 907.

For converting a negative number, module 902 is active. The INHIBIT and FORCE controls are inactive and the FORCE control of module 901 is active which means that all the currents of this module flow to output 907.

For this purpose, if it is assumed that the binary numbers to be converted are expressed in the two's complement code, the signal bit of the bit patterns applied to inputs 905 and 906 is used to act on the FORCE and INHIBIT controls.

In module 901, the inverse of the sign bit is applied to the FORCE control and the INHIBIT control is high. In module 902, the inverse of the signal bit is applied to the INHIBIT control and the FORCE control is high.

Consequently, the maximum output voltage will be obtained when no current flows to output 907 and the minimum output voltage will be obtained when all the currents flow to the output. Since output resistors R3-1 and R3-2 are connected to terminal 907, the dynamic range of the output signal will be, therefore again, equal to $2V_{REF}$.

Now the function of current source 1-12' and of its associated switching circuit 2-12' will be explained. In effect, this source ensures a particular function in this application. It prevents the analog values corresponding to bit patterns 0 000000000000 and 1 111111111111 from being similar.

As to pattern 0 000000000000, module 901 will be active and all the current sources and this module feed resistor R3-1, module 902 is inactive and there is no current source in this module to feed resistor R3-2. Therefore, an output at the 0 volt level is obtained.

As to pattern 1 111111111111, all the sources of module 901 feed resistor R3-1 and there is no source in module 902 to feed resistor R3-2. Consequently, without any additional source 1-12' in module 901, the same analog value 0 would be obtained for this pattern, which is not desired. Therefore, since in this case and for all the negative numbers applied to modules 901 and 902, source 1-12' of module 901 delivers a current and an additional current equal to the current corresponding to the less significant bit is provided to resistor R3-1.

This source which is not absolutely necessary to perform a normal digital/analog conversion is provided on the module to make the application to the A/D converter possible without modifying the modules.

The following table gives the analog values corresponding to the bit inputs in the case of thw two's complement code, while assuming that the elementary current unit corresponding to the less significant bit generates a voltage step equal to 0.635 millivolt.

| Sign bit | Bit 1 | Bit 2 | Bit 3 | Bit 4 | Bit 5 | Bit 6 | Bit 7 | Bit 8 | Bit 9 | Bit 10 | Bit 11 | Bit 12 | Bit 13 | Number of current units | Output voltage |
|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | VREF − |
| 0 | 1 | 1 | 1 | 1 | 1 | 1 | 1 | 1 | 1 | 1 | 1 | 1 | 0 | 2 | VREF −0,635mV |
| 0 | 1 | 1 | 1 | 1 | 1 | 1 | 1 | 1 | 1 | 1 | 1 | 0 | 1 | 3 | VREF −1,27mV |
| 0 | 1 | 1 | 1 | 1 | 1 | 1 | 1 | 1 | 1 | 1 | 1 | 0 | 0 | 4 | VREF −1,90mV |
| 0 | 0 | 0 | 0 | 0 | 0 | 0 | 0 | 0 | 0 | 0 | 0 | 1 | 0 | $2^{12}-2$ | +1,27mV |
| 0 | 0 | 0 | 0 | 0 | 0 | 0 | 0 | 0 | 0 | 0 | 0 | 0 | 1 | $2^{12}-1$ | +0,635mV |
| 0 | 0 | 0 | 0 | 0 | 0 | 0 | 0 | 0 | 0 | 0 | 0 | 0 | 0 | $2^{12}$ | OV |
| 1 | 1 | 1 | 1 | 1 | 1 | 1 | 1 | 1 | 1 | 1 | 1 | 1 | 1 | $2^{12}+1$ | −0,635mV |
| 1 | 1 | 1 | 1 | 1 | 1 | 1 | 1 | 1 | 1 | 1 | 1 | 1 | 0 | $2^{12}+2$ | −1,27mV |
| 1 | 1 | 1 | 1 | 1 | 1 | 1 | 1 | 1 | 1 | 1 | 1 | 0 | 1 | $2^{12}+3$ | −1,90mV |
| 1 | 0 | 0 | 0 | 0 | 0 | 0 | 0 | 0 | 0 | 0 | 0 | 1 | 0 | $2^{13}-2$ | −VREF +0,635mV |
| 1 | 0 | 0 | 0 | 0 | 0 | 0 | 0 | 0 | 0 | 0 | 0 | 0 | 1 | $2^{13}-1$ | −VREF |
| 1 | 0 | 0 | 0 | 0 | 0 | 0 | 0 | 0 | 0 | 0 | 0 | 0 | 0 | $2^{13}$ | −VREF −0,635mV |

In the preceding description of FIG. 9, the inverse of the sign is applied to the FORCE and INHIBIT controls of modules 901 and 902, respectively. It is obvious that the circuits required to perform the sign inversion can be provided in the module, in which case the sign can be directly applied to the FORCE and INHIBIT controls.

If the inverters are integrated in the module, it is obvious that the levels which should be applied to the module to make the FORCE and INHIBIT controls active or inactive will be the inverse of the ones given in the description of FIGS. 4 and 5.

The converter was described as allowing 12-bit words to be converted, but it is obvious that its structure can be readily adapted for converting N-bit words. For this purpose, the number of weighted current sources should be changed and the numbers n and m of sources in the first group and in the second group should be chosen to obtain the best accuracy/overall dimension ratio.

While the invention has been particularly shown and described with reference to preferred embodiments thereof, it will be understood by those skilled in the art that various changes in form and details may be made therein without departing from the spirit and scope of the invention.

Having thus described our invention, what we claim as new, and desire to secure by Letters Patent is:

1. An improved monolithic D/A converter able to convert N-bit words, of the type including N weighted current sources connected to switching circuits, each switching circuit being controlled by a bit of the word to be converted and steering the current of the associated source either towards an output line or towards a dump line, according to the value of the control bit, wherein the improvement comprises: a first group of weighted current sources of a first type including a high order master current source, n slave current source for generating the high order weighted currents and a slave source which is the image of one of said high order current sources, a second group of weighted current sources of a second type including a low order master current source and m slave sources generating the low order weighted currents, with N=n+m, a first group of n switching circuits of a first type connected to said n high order weighted current sources, each switching circuit being provided with an input receiving the current from the source to which it is connected and two outputs, one output being connected to the output line and the second one being connected to the dump line and at least a control input for receiving one bit of the word to be converted, a second group of m switching circuits of a second type connected to the m low order weighted current sources, each switching circuit being provided with an input for receiving the current from the source to which it is connected and two outputs, one output being connected to the output line and the second output being connected to the dump line and at least a control input receiving one bit of the word to be converted, a reference voltage generator being provided with an output delivering a stabilized voltage, first calibrating means connected between the output terminal of said reference voltage generator and said high order master current source, to provide a first calibrating current in accordance with the reference voltage, to said master source, second calibrating means connected to the output terminal of the reference voltage generator and receiving the current from said image source and providing to said low order master source a second calibrating current, the value of which is established relatively to the value of said image source current with a given multiple of two; said current sources of said first group being comprised of identical cells, each cell including a Darlington circuit of switching and driving transistors, the arrangement, comprising at least a pair of transistors, the switching transistor of each pair having an individually biased base and the driving transistor of the pair having a base connected in common with the corresponding bases of the other driving transistors in the other said cells in said source, the number of said cells in each said source defining the current of said source; and said current sources of said second group being comprised of a certain number of identical cells, each said cell including a single transistor.

2. An apparatus as described in claim 1 and further comprising: an output circuit including an output summing resistor provided with two terminals, one terminal being connected to the reference voltage generator output and the second terminal being connected to the output line on which is generated the converter output voltage; and a dump resistor provided with two terminals, one terminal being connected to the reference voltage generator output and the second terminal being connected to the dump line.

3. An apparatus as described in claim 1 wherein: said first calibrating means includes at least a calibrating resistor provided with a first terminal connected to said reference voltage generator output, and a circuit generating a virtual ground on the second terminal of said calibrating resistor, said circuit being provided with three terminals, the first said terminal being connected to the ground, the second said terminal being connected to said second terminal of said resistor and the third said terminal being connected to said high order master source to send the first calibrating current to said source.

4. An apparatus as described in claim 1 or 2 or 3 wherein: said second calibrating means includes a low order current calibrating circuit provided with three terminals, the first of said terminals being connected to said reference voltage generator output, the second of said terminals receiving the current generator by said image source and the third of said terminals being connected to the low order current master source to provide the second calibrating current equal to a determined fraction of said image source current, to said low order current master source.

* * * * *